United States Patent [19]

Weller et al.

[11] Patent Number: 5,136,598
[45] Date of Patent: Aug. 4, 1992

[54] MODULATED HIGH-POWER OPTICAL SOURCE

[75] Inventors: Joseph F. Weller, Ft. Washington, Md.; William K. Burns, Alexandria; Lew Goldberg, Fairfax, both of Va.

[73] Assignee: The United States of America as represented by the Secretary of the Navy, Washington, D.C.

[21] Appl. No.: 531,416

[22] Filed: May 31, 1990

[51] Int. Cl.$^5$ ............................................. H01S 3/10
[52] U.S. Cl. ........................................ 372/26; 372/18; 372/27; 372/28; 372/97; 372/101; 372/108
[58] Field of Search .................... 372/26, 101, 18, 97, 372/27, 28, 108; 455/609–611

[56] References Cited

U.S. PATENT DOCUMENTS

| | | | |
|---|---|---|---|
| 3,918,007 | 11/1975 | Waksberg | 372/97 |
| 4,246,548 | 1/1981 | Rutz | 372/101 |
| 4,556,980 | 12/1985 | Smith et al. | 372/18 |
| 4,686,485 | 8/1987 | Goldberg et al. | 372/18 |
| 4,755,016 | 7/1988 | DeLoach, Jr. et al. | 372/26 |
| 4,917,451 | 4/1990 | Chouinard et al. | 350/96.23 |
| 4,942,586 | 7/1990 | Lai | 372/101 |

Primary Examiner—Georgia Y. Epps
Attorney, Agent, or Firm—Thomas E. McDonnell; George Jameson

[57] ABSTRACT

An apparatus for generating a relatively high-power, modulated optical beam is disclosed. The apparatus comprises a first element for emitting a relatively low-power laser beam at a preselected wavelength, means for focusing the laser beam into a focused beam, a damage-resistant integrated optic modulator responsive to the focused beam for developing a modulated beam, optical means for shaping the modulated beam into a shaped modulated beam, and semiconductor means having a large active area responsive to the shaped, modulated beam for producing a relatively high-power, output modulated beam. In a first embodiment, the semiconductor means is a semiconductor amplifier which amplifies the modulated beam to produce the high-power, modulated output beam.

7 Claims, 2 Drawing Sheets

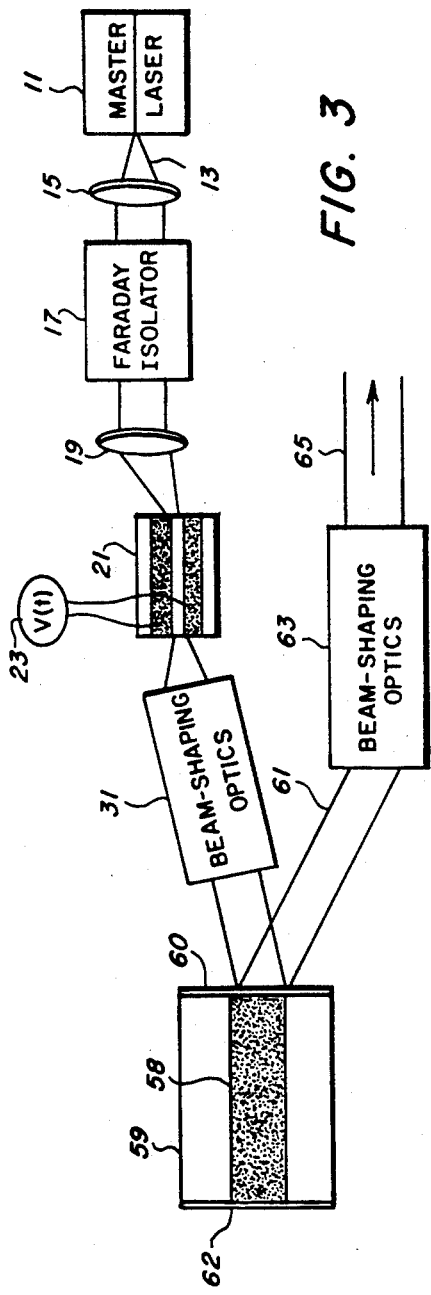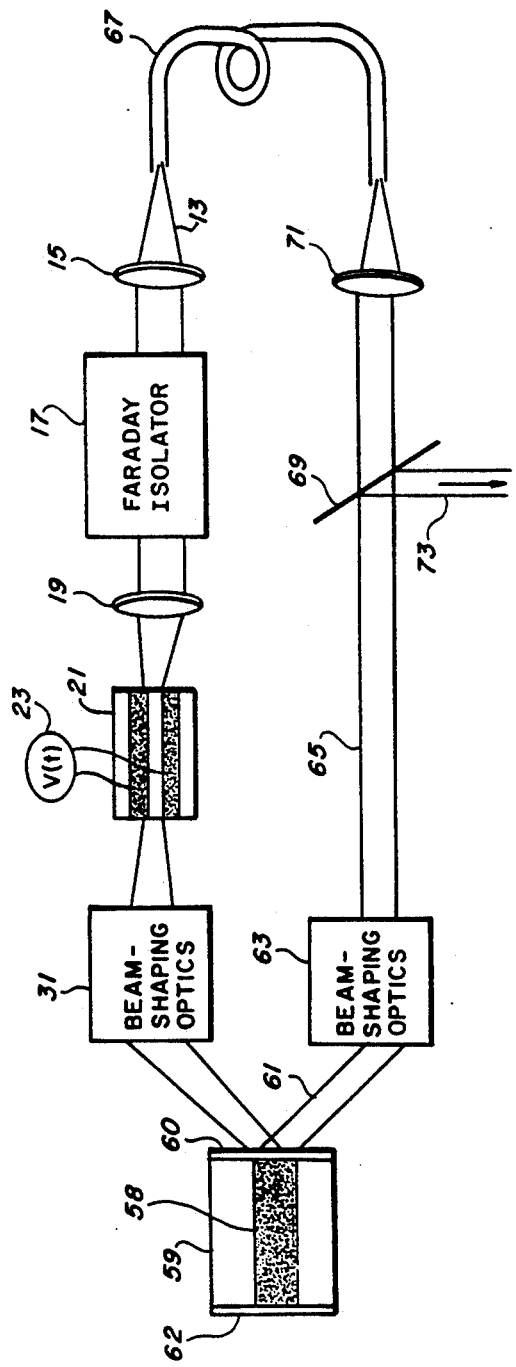

MODULATED HIGH-POWER OPTICAL SOURCE

BACKGROUND OF THE INVENTION

1. Field of the Invention

The present invention relates to modulated optical sources and particularly to an apparatus for generating a high-power, modulated optical output.

2. Description of the Prior Art

The current state of development of diffraction-limited laser diodes and diffraction-limited diode amplifiers can be grouped into five categories.

A first category pertains to single, narrow-stripe laser diodes operating in the fundamental spatial mode at power levels up to 200 milliwatts (mW). Lasers in this category can probably be directly modulated out to one or two gigabits per second (Gbits/s), but that is the limit due to electrical parasitics. Furthermore, the output power level in discrete devices probably will not go much higher than a few hundred milliwatts, which is the reason why laser diode arrays and broad stripe lasers have been developed.

A second category includes coupled stripe laser arrays and broad stripe lasers emitting in a diffraction-limited, far field lobe, under free running operation. In this category, truly diffraction-limited outputs have been difficult to achieve. In some structures a near diffraction-limited beam can be obtained only over a narrow range of laser diode current. Also, in most cases, even where there is a diffraction-limited lobe, most of the energy lies outside of the lobe and, thus, only a small amount can be used with diffraction-limited coupling optics.

A third category involves the injection-locking of a coupled stripe laser array/broad stripe laser using an external master laser. This third category of injection-locking has served to achieve diffraction limited emission of the laser diode array or broad stripe laser, making most of the far field usable for focussing or collimation, as well as improving the spectral output of the slave laser diode array or broad stripe laser. Frequency modulation has been accomplished by the simultaneous current modulation of the master laser and slave laser diode array (or slave broad stripe laser) to keep the two lasers within the locking bandwidth. That technique is limited to low bandwidth frequency modulation and does not lend itself to data transmission except in an extremely simple format.

A fourth category relates to coupled stripe laser diode arrays and broad stripe lasers operating in external cavities. This fourth category of using external cavities suffers from a limited modulation bandwidth due to a long photon lifetime inside the cavity which is normally centimeters in length.

A fifth category comprises single pass or resonant high-power, large active area diode amplifier with an input optical signal from a low-power master laser.

An alternative approach that could be used is an external modulator which phase or intensity modulates an optical carrier and a laser diode array/broad area laser or amplifier which effectively amplifies the output power of the modulator. Bulk modulators normally require high electric fields and have transit time limitations. These disadvantages led to the development of integrated optic modulators, normally in lithium niobate ($LiNbO_3$) or lithium tantalate ($LiTaO_3$). The main problem in these modulators is optical damage or photorefractive changes due to the high fields in the two-dimensional waveguides fabricated in these materials.

Recently there have been several new developments in waveguide fabrication where optical damage can be avoided. A first new development involves waveguides fabricated in potassium titanyl phosphate ($KTiOPO_4$ or KTP), as reported by Bierlein et al. ("Fabrication and Characterization of Optical Waveguides in KTP", paper PDP5, OFC, Reno, 1987). Another waveguide system that uses proton exchange in lithium tantalate also has a substantially higher optical damage threshold than $LiNbO_3$. No optical damage was observed at a 4 mW power output from a single mode waveguide of such a waveguide system at a wavelength of 0.633 microns. (See T. Findalky et al., "High Quality $LiTaO_3$ Integrated-Optical Waveguides and Devices Fabricated by the Annealed Proton-Exchange Technique", Opt. Letts., Vol. 13, 797, 1988.)

Heretofore, no high-power, modulated optical source has utilized these newly developed, damage-resistant waveguides with injection-locked arrays, semiconductor amplifiers or external cavity lasers to obtain a phase- or intensity-modulated, high-power optical source that is compact with a bandwidth in the multi-gigahertz range.

OBJECTS OF THE INVENTION

Accordingly, one object of the invention is to provide an improved phase-modulated or intensity-modulated, high-power optical source.

Another object of the Invention is to provide an apparatus which utilizes a damage-resistant, integrated optic modulator disposed between a master laser and a semiconductor amplifier having a large active area.

Another object of the invention is to provide an apparatus for modulating a relatively low-power optical carrier beam before the resultant modulated beam is used to produce an injection-locked, relatively high-power, modulated output beam.

Another object of the invention is to provide an apparatus for modulating a relatively low-power optical carrier beam before the resultant modulated beam is amplified to a high power level.

Another object of the invention is to provide an apparatus which modulates an optical carrier in a damage-resistant, integrated optic modulator in the low optical power part of an injection-locked array.

Another object of the invention is to provide an apparatus which modulates an optical carrier beam in a damage-resistant, integrated optical modulator disposed between a master laser and an injection-locked array.

Another object of the invention is to provide an apparatus which utilizes a $KTiOPO_4$ or $LiTaO_3$ integrated optic modulator, or other damage-resistant, integrated optic modulator, disposed between a master laser and an injection-locked broad stripe laser to modulate a carrier beam from the master laser at the low optical power part of the apparatus.

Another object of the invention is to provide an apparatus which utilizes a damage-resistant, integrated optic modulator disposed between a master laser and a broad stripe amplifier to modulate an optical beam from the master laser before the resultant modulated beam is amplified by the broad stripe amplifier.

A further object of the invention is to provide an apparatus for modulating in a damage-resistant, integrated optic modulator a low-power carrier beam from a spatial filter in an external cavity laser before the resultant modulated carrier beam is used to injection-lock a laser array or a broad stripe laser.

SUMMARY OF THE INVENTION

These and other objects are achieved in the present invention by providing an apparatus which comprises a source for emitting a relatively low-power laser beam at a preselected wavelength, optical means for focusing the laser beam, a damage-resistant modulator responsive to the focused laser beam for developing a modulated beam, beam-shaping optics for shaping the modulated beam into a focused beam, and a semiconductor structure having a large active area responsive to the focused modulated beam for producing a modulated, relatively high-power, modulated output beam.

BRIEF DESCRIPTION OF THE DRAWINGS

These and other objects, features and advantages of the invention, as well as the invention itself, will become better understood by reference to the following detailed description when considered in connection with the accompanying drawings wherein like reference numerals designate identical or corresponding parts throughout the several views and wherein:

FIG. 3 illustrates a third embodiment of the invention; and

FIG. 4 illustrates a fourth embodiment of the invention.

DETAILED DESCRIPTION OF THE PREFERRED EMBODIMENTS

Figure 1:
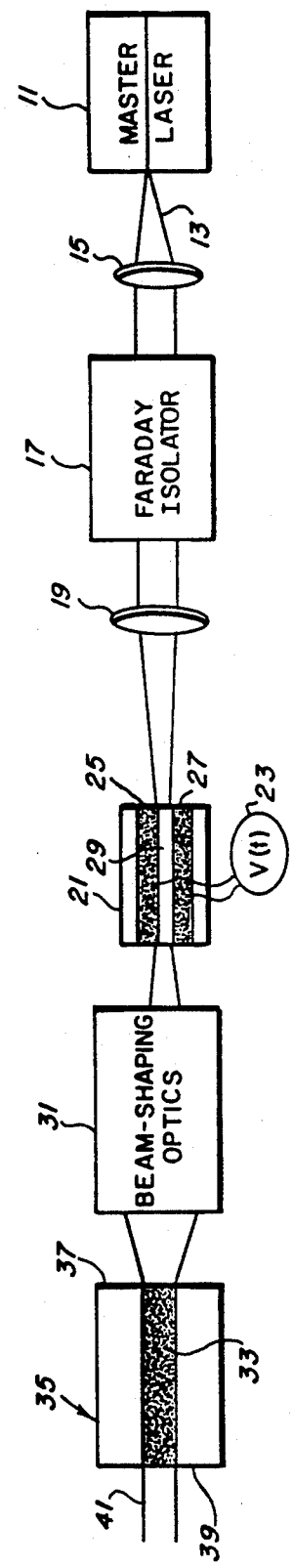
FIG. 1 illustrates a first embodiment of the invention.

Referring now to FIG. 1, a schematic block diagram of a first embodiment of the invention is shown. In this first embodiment, basically a low-power, laser beam is modulated in a damage-resistant, integrated optic waveguide modulator or integrated optic modulator before the low-power, modulated beam is injected into the large active area of a high-power amplifier for high power amplification of that low-power, modulated beam.

In the operation of the first embodiment of FIG. 1, a single-stripe, single-mode, master laser 11 produces a laser beam 13 at a preselected wavelength. The laser beam 13 is collimated by a collimating lens 15 before being applied to a Faraday isolator 17. Faraday isolator 17 rotates the polarization of the collimated laser beam 13 by 45 degrees in an exemplary counter-clockwise (CCW) direction and also prevents undesired light from subsequent components from feeding back into the master laser 11. A focusing lens 19 focuses light from the Faraday isolator 17 into a damage-resistant, integrated optic modulator or integrated optic waveguide modulator 21. A modulation source 23 supplies a modulating signal, V(t), to modulate the focused light passing through the modulator 21.

The damage-resistant, integrated optic modulator 21 is fabricated of preselected materials to minimize optical damage. As discussed above, the damage-resistant, integrated optic modulator 21 can be fabricated with, for example, proton-exchanged $LiTaO_3$ waveguides or potassium titanyl phosphate ($KTiOPO_4$ or KTP) waveguides to minimize optical damage to the modulator 21.

The integrated optic modulator 21 could be configured to produce a phase modulation or an intensity modulation of the focused light beam from the lens 19. For example, simple electrodes 25 and 27 could be disposed on the surface of the modulator 21 on opposite sides of a waveguide 29 to produce a phase modulation of the focused beam passing along the waveguide 29 when the modulating signal, V(t), is applied across the electrodes 25 and 27. Similarly, if waveguides (not shown) were disposed in a Mach-Zehnder configuration, intensity modulation could be utilized to modulate the focused beam from the lens 19. The application of such a phase or intensity modulation technique to an integrated optic modulator is well known in the art and, hence, requires no further discussion.

The modulated beam from the integrated optic modulator 21 is incident on beam-shaping optics 31 which shape and focus the modulated beam into a large active region or area 33 of a semiconductor structure 35. The semiconductor structure 35 in this embodiment can be a high-power, diode array amplifier or a high-power, broad stripe amplifier, which has anti-reflection coatings 37 and 39 on front and rear surfaces of the semiconductor structure 35.

The active area 33 of the semiconductor structure 35 is very thin and relatively wide. On the other hand, the output beam of the integrated optic modulator 21 is very round in shape. The beam-shaping optics 31 operate to spread out the round output beam of the modulator 21 a into thin beam in order to efficiently couple light from the modulator 21 into a substantial portion of the front surface (not shown) of the thin active area 33 of the semiconductor structure 35. To accomplish this operation, the beam-shaping optics 31 can include, for example, cylindrical, spherical and focusing lenses (not shown).

The resultant, output, high-power, modulated beam 41 is sequentially passed out of the active area 33 and the anti-reflection coating 39 of the semiconductor structure 35. The system of this first embodiment can be used in, for example, a communications application.

Figure 2:
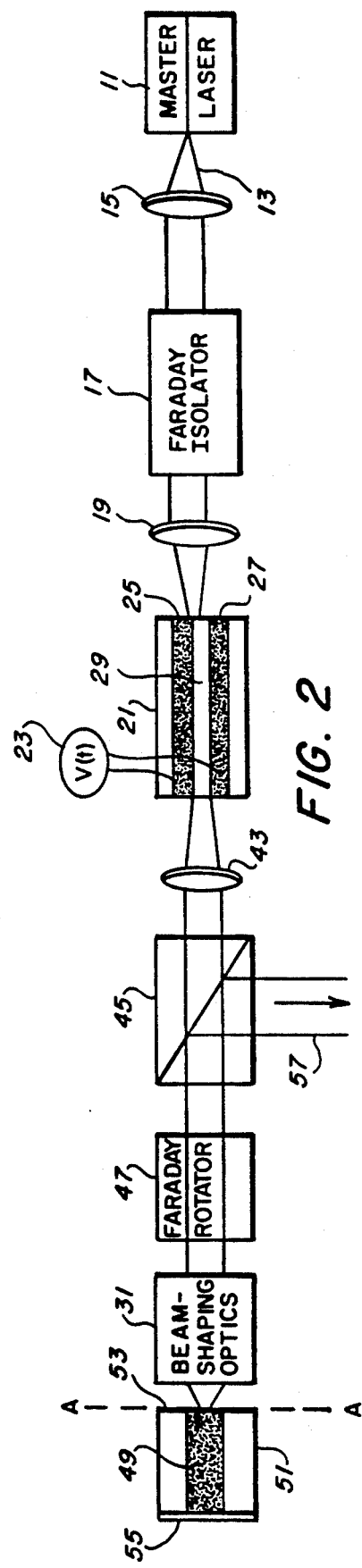
FIG. 2 illustrates a second embodiment of the invention.

Referring now to FIG. 2, a schematic block diagram of a second embodiment of the invention is shown. In this second embodiment, a low-power, laser beam is modulated in a damage-resistant, integrated optic modulator before the low-power, modulated beam is injected into the large active area of a reflective, high-power amplifier for a double high-power amplification of that low-power, modulated beam.

The second embodiment of FIG. 2 includes the master laser 11, the collimating lens 15, the Faraday isolator 17, the focusing lens 19, the damage-resistant, integrated optic modulator 21, the modulation source 23 and the beam-shaping optics 31 of FIG. 1. Since the structure and operation of these components are the same as those discussed in the embodiment of FIG. 1, no further description of these components is necessary.

In operation, a collimating lens 43 collimates the modulated beam from the damage-resistant, integrated optic modulator 21 and passes that resultant collimated modulated beam to a polarizing beam splitter 45. The polarizing beam splitter 45 is oriented so that it passes the polarization of the collimated modulated beam through a Faraday rotator 47. This Faraday rotator 47 rotates the polarization of the collimated modulated beam by 45 degrees in an exemplary clockwise (CW) direction.

The polarization-rotated, collimated, modulated beam from the Faraday rotator 47 passes through the beam-shaping optics 31 which shape and focus the polarization-rotated, collimated, modulated beam into a large active region or area 49 of a semiconductor structure 51. The semiconductor structure 51 in this second embodiment can be a high-power, diode array amplifier or a high-power, broad stripe amplifier, which has an anti-reflective coating 53 on its front facet (not shown) and a highly reflective coating 55 on its back facet (not shown).

The polarization of the modulated beam at the input of the amplifier structure 51 is parallel to a semiconductor junction plane AA of the amplifier structure 51.

With the highly reflective coating 55 on its back facet, the amplifier structure 51 is called a reflective amplifier. Such a reflective amplifier produces a double pass through it, as will now be explained.

The modulated beam from the beam-shaping optics 31 passes into the large active area 49 of the amplifier structure 51, propagates through that large active area 49, and is amplified. When the modulated beam reaches the highly reflective coating 55 on its back facet, it is reflected back through the large active area 49 in the backward direction, and is amplified again. This twice-amplified modulated beam, which is now moving in the backward direction, comes out of the large active area 49, passes through the beam-shaping optics 31 and again passes through the Faraday rotator 47. In this backward pass through the Faraday rotator 47, the polarization of the twice-amplified modulated beam is rotated by the Faraday rotator 47 an additional 45 degrees in the exemplary CW direction. As a result, the polarization of the twice-amplified, modulated beam at the output of the Faraday rotator 47 is now orthogonal or 90 degrees with respect to the polarization of the unamplified modulated beam at the input of the Faraday rotator 47.

When the twice-amplified modulated beam from the Faraday rotator 47 is incident on the polarizing beam splitter 45 in the backward direction, it is oriented 90 degrees with respect to the orientation of the polarizing beam splitter 45. As a result, the twice-amplified modulated beam incident on the polarizing beam splitter 45 will be reflected at a right angle out of the system by the polarizing beam splitter 45. This output 57 of the system is the output, high-power, modulated beam, which can be used in a communications application.

Referring now to FIG. 3, a schematic block diagram of a third embodiment of the invention is shown. In this third embodiment a low-power, laser beam from a master laser is modulated in a damage-resistant, integrated optic modulator before the resultant, low-power, modulated laser beam is used to injection-lock a high-power laser structure, such as a laser diode array or a broad stripe laser, in order to develop a high-power, output modulated beam.

The third embodiment of FIG. 3 includes the master laser 11, the collimating lens 15, the Faraday isolator 17, the focusing lens 19, the damage-resistant, integrated optic modulator 21, the modulation source 23 and the beam-shaping optics 31 of FIG. 1. Since the structure and operation of these components are the same as those discussed in the embodiment of FIG. 1, no further description of these components is necessary.

In operation, the modulated beam from the damage-resistant, integrated optic modulator 21 is shaped into a slit-like shape and focused by the beam-shaping optics 31 into a thin and relatively wide active area 58 of a semiconductor structure 59. The semiconductor structure 59 in this third embodiment can be a laser diode array or a broad stripe laser, which has a low reflectivity coating 60 on its front facet (not shown) and a highly reflective coating 62 on its back facet (not shown).

The shaped, modulated beam from the beam-shaping optics 31 injection-locks the semiconductor laser structure 59 to the wavelength of the beam 13 from the master laser 11 to cause the semiconductor laser structure 59 to emit a diffraction-limited beam having the same wavelength of the beam 13.

In the injection-locked condition the spectrum and far field intensity distribution of the emission from the semiconductor laser structure are controlled by the master laser 11. The output of the injection-locked semiconductor laser structure 59 has a single spatial mode and a single spectral mode. Furthermore, the output of the semiconductor laser structure 59 has a spectral linewidth equal to that of the beam 13 from the master laser 11. Since the master laser 11 has a linewidth which is much smaller than that of the uninjected semiconductor laser structure 59 the linewidth of the injection-locked, semiconductor laser structure 59 thus is considerably less than that of the free-running master Such an injection-locking operation of a diode laser array or of a broad stripe laser is well known in the art. See U.S. Pat. No. 4,686,485 (Goldberg et al.) for a more detailed explanation of the injection locking of laser diode arrays. For a more detailed explanation of the injection locking of a broad stripe laser, see the publication of Goldberg et al., "Injection Locking Characteristics of a 1W Broad Stripe Laser Diode", Appl. Phys. Lett. 53 (20), pages 1900–1902 (Nov. 14, 1988).

The injection-locked, semiconductor laser structure 59 emits a single-lobe, diffraction-limited beam 61. Beam-shaping optics 63 convert the diffraction-limited beam 61 of emission from the semiconductor laser structure 59 into a beam 65 of circular cross section. This beam 65 is the output, high-power, modulated beam of the third embodiment of FIG. 3. The system of this third embodiment can also be used in an exemplary communications application.

Referring now to FIG. 4, a schematic block diagram of a fourth embodiment of the invention is shown. This fourth embodiment utilizes an external ring cavity configuration. In this fourth embodiment, a laser beam is modulated in a damage-resistant, integrated optic modulator before the resultant, low-power, modulated beam is used to injection-lock a high-power laser structure, such as a laser diode array or a broad stripe laser, in order to develop a high-power, output modulated beam. A relatively small portion of this high-power, output modulated beam is fed back through an external laser cavity to the high-power laser structure to maintain the lasing operation in this fourth embodiment.

This embodiment of FIG. 4 is a modification of the third embodiment of FIG. 3, wherein a polarization-preserving, single-mode fiber or spatial filter 67 replaces the master laser 11 of FIG. 3 and a serially connected beam splitter or output coupler 69 and a focusing lens 71 are operationally coupled between the beam-shaping optics 63 and the single-mode fiber or spatial filter 67.

The remaining components of this fourth embodiment of FIG. 4 comprise the collimating lens 15, the Faraday isolator 17, the focusing lens 19, the damage-resistant, integrated optic modulator 21, the modulation source 23, the beam-shaping optics 31 and the semiconductor laser structure 49 of FIG. 3. Since the structure and operation of these components are the same as those discussed in the embodiment of FIG. 3, no further description of these components is necessary.

In operation, the high-power, output modulated beam 65 is focused by the beam shaping optics 63 onto the beam splitter or optical coupler 69. An exemplary 90 percent of this beam 65 is reflected off of the beamsplitter 69 and out of the system of FIG. 4 as a high-power, output modulated beam 73. The remaining exemplary 10 percent of the beam 65 is transmitted as beam 13 through the beam splitter 69 and focused by the focusing lens 71 into the single-mode fiber or spatial filter 67. After passing through the single-mode fiber or spatial filter 67, the light beam 13 is incident on the collimating lens 15.

The operations of the components 15, 17, 19, 21, 23, 31, 59 and 63 in this embodiment have been previously discussed and, hence, require no further description. Thus, in this fourth embodiment, basically most of the light from the semiconductor laser structure 59 is outputted from the beam splitter 69, while the remaining portion of light is coupled back through previously discussed components to the modulator 21 for modulation by the modulation signal V(t), and the resultant modulated beam from the modulator is used to injection-lock the semiconductor laser structure 59 to enable the semiconductor laser structure 59 to continuously develop and apply the high-power, modulated beam to the beam splitter 69.

Therefore, what has been described is an apparatus which utilizes a damage-resistant, integrated optic modulator interposed between a source of a relatively low-power, laser beam and a semiconductor structure having a large active area for modulating the relatively low-power, laser beam in the modulator, before the resultant modulated beam is applied to the semiconductor structure to cause the semiconductor structure to produce a high-power, output modulated beam.

It should therefore readily be understood that many modifications and variations of the present invention are possible within the purview of the claimed invention, It is therefore to be understood that, within the scope of the appended claims, the invention may be practiced otherwise than as specifically described.

What is claimed and desired to be secured by Letters Patent of the United States is:

1. An apparatus for generating a relatively high-power, output modulated beam, said apparatus comprising:

means for emitting a relatively low-power, laser beam at a preselected wavelength;

means for focusing said laser beam;

means responsive to said focused beam for developing a modulated beam, said developing means including a damage-resistant, integrated optic modulator; said focusing means including: a first lens for collimating the laser beam from said emitting means, Faraday isolator means for isolating said emitting means from optical feedback, and a second lens for focusing said laser beam from said Faraday isolator means into said developing means;

means for shaping said modulated beam into a focused beam; and a single semiconductor means having a large active area responsive to said focused, modulated beam for producing the high-power, output modulated beam, said semiconductor means being a semiconductor amplifier selected from the group consisting of an array amplifier and a broad stripe amplifier;

said shaping means including optical means for efficiently coupling said modulated beam into said large active area of said semiconductor means.

2. The apparatus of claim 1 wherein:

said semiconductor amplifier has anti-reflection-coated input and rear facets, said semiconductor amplifier amplifying said focused beam as said focused beam passes therethrough as said high-power, output modulator beam.

3. The apparatus of claim 1 wherein:

said emitting means includes a master laser for emitting said laser beam at said preselected wavelength.

4. An apparatus for generating a relatively high-power, output modulated beam, said apparatus comprising:

means for emitting a relatively low-power, laser beam at a preselected wavelength, said emitting means including a master laser for emitting said laser beam at said preselected wavelength;

means for focusing said laser beam;

means responsive to said focused beam for developing a modulated beam, said developing means including a damage-resistant, integrated optic modulator; said focusing means including: a first lens for collimating the laser beam from said emitting means, Faraday isolator means for isolating said emitting means from optical feedback, and a second lens for focusing said laser beam from said Faraday isolator means into said developing means;

means for shaping said modulated beam into a focused beam; and a single semiconductor means having a large active area responsive to said focused, modulated beam for producing the high-power, output modulated beam, said semiconductor means including a semiconductor amplifier selected from the group consisting of an array amplifier and a broad stripe amplifier, said semiconductor amplifier having an anti-reflection coated, input facet containing the edge of a semiconductor junction plane and a highly reflective rear facet;

said shaping means including optical means for efficiently coupling said modulated beam into said large active area of said semiconductor means, said optical means further including:

a collimating lens for collimating said modulated beam;

a polarizing beam splitter oriented to pass said collimated modulated beam therethrough; and a Faraday rotator for rotating the polarization of said collimated modulated beam by a preselected angle of rotation;

said shaping means passing said polarization-rotated beam from said Faraday rotator therethrough as said focused beam;

said semiconductor amplifier amplifying said focused beam as said focused beam passes therethrough to said highly reflective rear facet of said semiconductor amplifier, said highly reflective rear facet reflecting said amplifier focused beam back through said semiconductor amplifier for a second amplification of said focused beam;

said shaping means collimating said twice-amplified beam from said semiconductor amplifier;

said Faraday rotator rotating the polarization of said twice-amplified beam from said shaping means by an additional preselected angle of rotation; and said polarizing beam splitter reflecting the polarization-rotated, twice-amplified beam out of said apparatus as said high-power, output modulated beam.

5. An apparatus for generating a relatively high-power, output modulated beam, said apparatus comprising:

means for emitting a relatively low-power, laser beam at a preselected wavelength, said emitting means including a spatial filter;

means for focusing said laser beam;

means responsive to said focused beam for developing a modulated beam, said developing means including a damage-resistant, integrated optic modulator; said focusing means including: a first lens for collimating the laser beam from said emitting means, Faraday isolator means for isolating said emitting means from optical feedback, and a second lens for focusing said laser beam from said Faraday isolator means into said developing means;

means for shaping said modulated beam into a focused beam;

a single semiconductor means having a large active area responsive to said focused, modulated beam for producing the high-power, output modulator beam, said semiconductor means being selected from the group consisting of a diode laser array and a broad strip laser;

beam-shaping optics for shaping said high-power, modulated output beam into a desired beam shape;

said shaping means including optical means for efficiently coupling said modulated beam from said integrated optic modulator into said large active area of said semiconductor means to injection-lock said semiconductor meand to said preselected wavelength, said injection-locked semiconductor means emitting a diffraction-limited beam with said preselected wavelength; and said optical means further including:
an output coupler disposed in the optical path of said beam-shaped output beam to output from said optical means a first portion of said beam-shaped output beam and to pass a second portion of said beam-shaped output beam; and a focusing lens for focusing said second portion of said beam-shaped output beam into said spatial filter as said laser beam, said laser beam passing through said spatial filter to said first lens in said focusing means.

6. The apparatus of claim 5 wherein:
said spatial filter is a single-mode fiber.

7. The apparatus of claim 5 wherein:
said spatial filter is a polarization-preserving, single-mode fiber.

* * * * *